United States Patent
Kimura et al.

Patent Number: 5,414,591
Date of Patent: May 9, 1995

[54] MAGNETIC DISK STORAGE SYSTEM

[75] Inventors: Hideyuki Kimura, Tsuchiura; Tsuyoshi Takahashi, Odawara; Tomio Suzuki, Hiratsuka; Toshio Ohdaira, Odawara; Kouki Uefune, Minamiashigara; Yuji Nishimura, Odawara, all of Japan

[73] Assignee: Hitachi, Ltd., Tokyo, Japan

[21] Appl. No.: 868,421

[22] Filed: Apr. 15, 1992

[30] Foreign Application Priority Data

Apr. 15, 1991 [JP] Japan .................. 3-082209

[51] Int. Cl.$^6$ .............................. H05T 7/20
[52] U.S. Cl. ..................... 361/695; 361/687
[58] Field of Search ................... 165/104.33; 361/687–688, 694–697, 724, 725, 727

[56] References Cited

U.S. PATENT DOCUMENTS

| | | | |
|---|---|---|---|
| 4,489,363 | 12/1984 | Geldberg | 361/693 |
| 4,642,715 | 2/1987 | Ende | 361/687 |
| 4,648,007 | 3/1987 | Garner | 361/695 |
| 4,817,865 | 4/1989 | Wray | 361/695 |
| 4,967,155 | 10/1990 | Magnuson | 361/687 |

FOREIGN PATENT DOCUMENTS

| | | | |
|---|---|---|---|
| 0099092 | 1/1984 | European Pat. Off. | 361/694 |
| 3419688 | 11/1985 | Germany | 361/691 |
| 239394 | 4/1986 | Japan . | |
| 2-98197 | 10/1988 | Japan . | |
| 266599 | 4/1989 | Japan . | |
| 1218499 | 5/1990 | Japan | 361/695 |
| 2194598 | 8/1990 | Japan | 361/392 |
| 2254797 | 10/1990 | Japan | 361/694 |
| 3-97187 | 4/1991 | Japan . | |
| 2177096 | 8/1991 | Japan | 361/695 |

*Primary Examiner*—Gregory D. Thompson
*Attorney, Agent, or Firm*—Antonelli, Terry, Stout & Kraus

[57] ABSTRACT

A magnetic disk storage system in which magnetic disk drives can be cooled effectively, and even if a blast device for one of he magnetic disk drives fall into trouble or cease operation, a temperature rise of this magnetic disk drive can be suppressed to the minimum. For this purpose, in the magnetic disk storage system containing a plurality of magnetic disk drives, blase devices ae provided for each of the disk drives, and the disk drives are separated by partitions in which openings are formed so that the cooling air can be passed between adjacent magnetic disk drives. With this structure, even if a blast device for a certain magnetic disk drive is out of order or stopped, a part of the cooling air from a blase device for the adjacent disk drives flows into the magnetic disk drive in question through the openings formed in the partitions, and consequently, the temperature rise of the magnetic disk drive whose blase device ceases operation can be suppressed to the minimum, to thereby enhance the reliability of the magnetic disk storage system.

16 Claims, 16 Drawing Sheets

MAGNETIC DISK STORAGE SYSTEM

BACKGROUND OF THE INVENTION

The present invention relates to a casing structure of a magnetic disk storage system and, more particularly, to a casing structure of a magnetic disk storage system in which a plurality of magnetic disk drives, sometimes called head disk assemblies, are provided, which casing structure can reduce a temperature rise and can suppress a temperature rise to the minimum even if blast means such as cooling fans are out of order.

In a conventional magnetic disk storage system in which a plurality of magnetic disk drives are provided, as disclosed in Japanese Patent Unexamined Publication No. 62-239394, air passages and blast means, independent from one another, are provided surrounding the magnetic disk drives so as to cool the respective magnetic disk drives separately and individually. In another conventional system, as disclosed in Japanese Patent Unexamined Publication No. 2-266599, top and bottom surfaces of a casing of each magnetic disk drive are opened, and a fan is installed to produce a cooling air flow from the bottom toward the top, in order to cool piled magnetic disk drives successively.

As a measure to deal with troubles of blast means, as disclosed in Japanese Patent Unexamined Publication No. 3-97187, there is a method in which two blast means are provided for each magnetic disk drive so that, when one of the blast means falls into trouble, the other will be operated.

The conventional technique disclosed in Japanese Patent Unexamined Publication No. 62-239394 includes highly effective cooling means. However, the blast means for the magnetic disk drives are separate and independent from one another, and consequently, if one of the blast means is out of order or stopped, the temperature of the magnetic disk drive whose blast means cease is raised. In the conventional technique disclosed in Japanese Patent Unexamined Publication No. 2-266599, the piled magnetic disk drives are cooled successively from the bottom to the top. Therefore, the temperature of cooling air is raised at the downstream side of the flow due to heat exchange with heat generated from the magnetic disk drives. As a result, the higher that the magnetic disk drives are located, the higher the temperatures thereof become. Especially in the case of a disk array system in which the number of vertically piled layers is larger, a temperature difference between upper disk drives and lower ones tends to increase. Thus, concerning these two techniques, it is feared that positioning accuracy of disk drives will be degraded to thereby deteriorate the reliability of the magnetic disk storage system.

In the conventional technique disclosed in Japanese Patent Unexamined Publication No. 3-97187, which is a measure to deal with troubles of the blast means, two blast means are provided for each of a plurality of magnetic disk drives. In consequence, the number of the required blast means is twice as large as that of the magnetic disk drives, thereby enlarging the spaces they occupy and increasing their costs. This method involves other problems. For example, it is necessary to provide a control circuit for switching the blast means when one of the blast means falls into trouble.

SUMMARY OF THE INVENTION

It is therefore an object of the invention to provide a highly reliable magnetic disk storage system in which magnetic disk drives are cooled effectively so that temperature rises of the magnetic disk drives are equally reduced, and in case that blast means for a certain magnetic disk drive is out of order or stopped, a temperature rise of the magnetic disk drive provided with the blast means which is out of order is suppressed to the minimum. Another object of the invention is to provide a structure which facilitates maintenance and exchange of the magnetic disk drives by minimum units (one by one). A further object is to realize the reduction of thermal off-track which is an essential factor in preventing decreases in durations of component parts and improving the positioning accuracy.

In order to achieve these objects, the invention provides a magnetic disk storage system comprising a plurality of magnetic disk drives provided in a system casing, each of the magnetic disk drives including magnetic disks for storing information, magnetic heads for reading and writing information between the magnetic disks, a carriage mechanism for positioning the magnetic heads, and a housing for hermetically sealing them, the magnetic disk storage system further comprising partitions for separating and arranging the magnetic disk drives which are provided between the magnetic disk drives so as to form container chambers of the magnetic disk drives, and blast means for cooling the magnetic disk drives which are provided in the container chambers, the partitions being formed with openings through which cooling air is passed between adjacent two of the container chambers.

The housing surrounds each magnetic disk drive so as to prevent foreign materials from sticking to the heads and disk surfaces. A plurality of such integral magnetic disk drives are installed in the casing. The magnetic disk drives are separated individually by the partitions for the sake of convenience of the maintenance and inspection. Each of the chambers containing the magnetic disk drives is provided with the blast means, such as a fan, for cooling the respective magnetic disk drive, and vent holes through which the air is supplied to and discharged from the blast means. With this arrangement, the magnetic disk drives can be effectively cooled. In this invention, openings are further formed in the partitions defining the chambers in addition to the vent holes. Thus, even if the fan which is originally intended to supply air flows to a certain magnetic disk drive can not function normally due to some trouble or the like, parts of air flows from fans for adjacent disk drives can be introduced through the above-mentioned openings into the magnetic disk drive whose fan ceases, to thereby cool all the magnetic disk drives. Since cooling air can be blown against any of the magnetic disk drives, temperature rises of the disk drives can be suppressed to the minimum in order to prevent reading/writing trouble and malfunction.

Moreover, a flow resistance such as a filter is provided at the upstream or downstream side of flows from the fans, and consequently, back flows of the cooling air can be prevented to thereby supply sufficient cooling air to each of the disk drives.

DETAILED DESCRIPTION OF THE INVENTION

Figure 1:
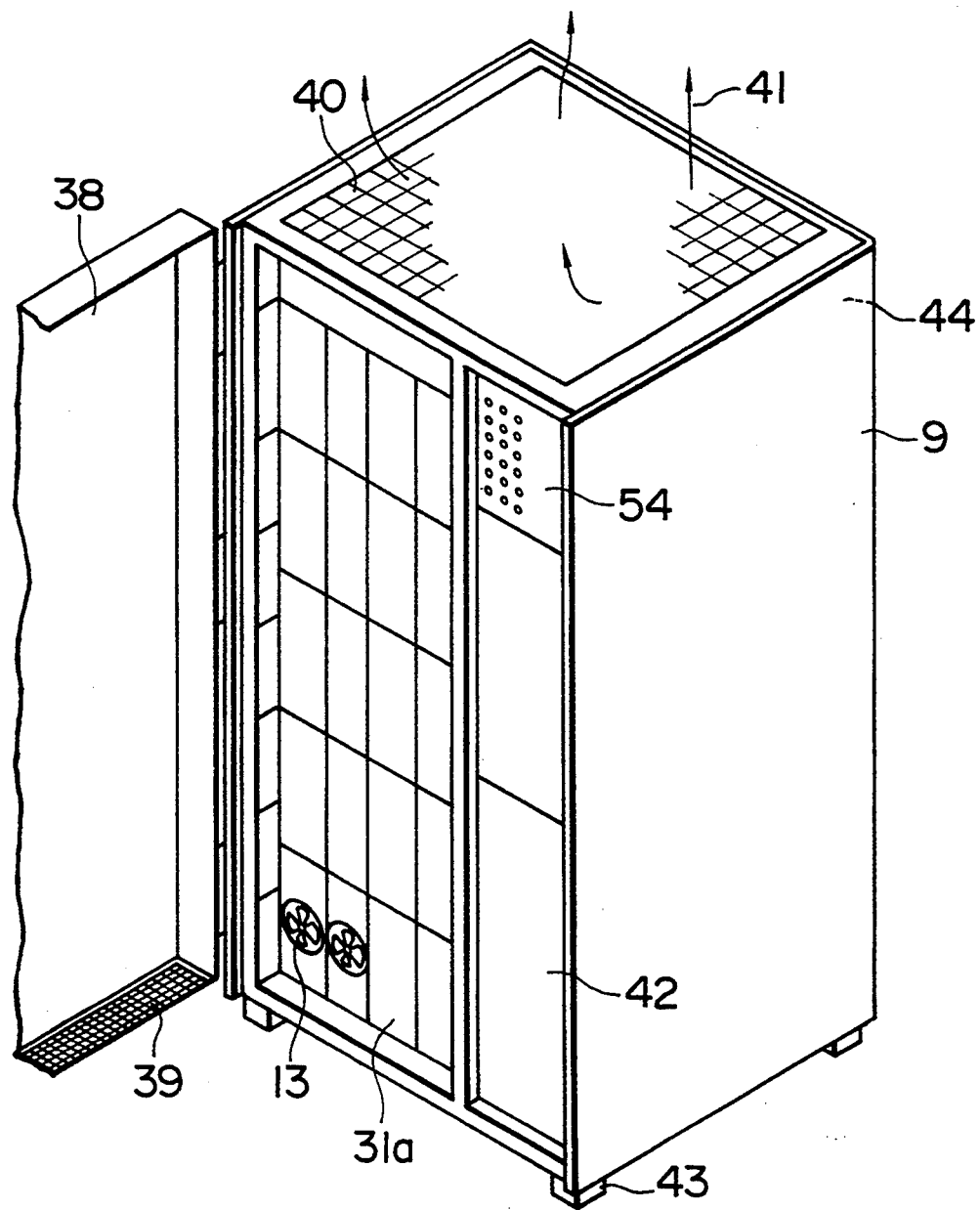
FIG. 1 is a perspective view showing one embodiment of a magnetic disk storage system according to the present invention.

One embodiment of the present invention will be hereinafter described with reference to FIG. 1. FIG. 1 is a perspective view showing a magnetic disk storage system comprising a plurality of magnetic disk units 31a provided in one casing 9.

In this embodiment, 20 disk units 31a are arrayed in four rows and piled in five layers. The magnetic disk storage system includes a door 38 for opening and closing the entire surface, an inlet 39 of cooling air which is formed at the bottom of the door 38, an outlet 40 of cooling air, a power source, control circuits and the like 42 for the whole system, and elevating supports or casters 43 of the casing 9. In the drawing, reference numeral 41 indicates a flow of cooling air. Preferably, the power source, control circuits and the like 42 should be cooled not by blower fans 13 attached to the respective disk units but by other fans. In some cases, however, they may be arranged to be cooled by the cooling air 41 which has cooled the disk units 31a. Cooling air flows into the system through the door 38 and the cooling air inlet 39 formed at the bottom of the casing 9, moves upwardly, and is distributed to the disk units 31a by the respective blower fans 13. While passing through a duct in each of the disk units 31a, the cooling air cools a magnetic disk drive 1 (which is sometimes called a magnetic disk assembly) and so forth in the unit. Then, the cooling air gathers and moves upwardly in a collecting duct 44, and it is released out of the casing 9 through the outlet 40 at the top of the casing 9.

Figure 2:
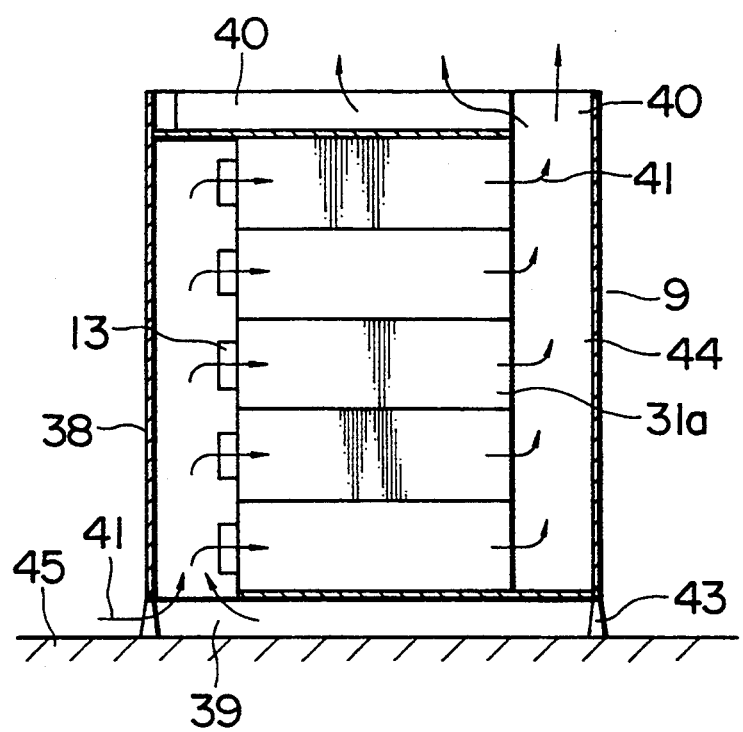
FIG. 2 is a side sectional view of the magnetic disk storage system shown in FIG. 1.

FIG. 2 is a side sectional view of the casing 9 shown in FIG. 1, illustrative of the above-described cooling method. Reference numeral 45 denotes a floor on which the casing 9 is mounted. In this embodiment, additional fans may be installed in the collecting duct 44 of the cooling air 41 in order to increase an amount of cooling air introduced through the blower fans 13 of the disk units 31a. Preferably, the additional fans should be installed in the vicinity of the outlet 40 of the collecting duct 44. Moreover, rising air-guide plates may be provided in those portions of the collecting duct 44 which are adjacent to exits of the cooling air 41 of the respective disk units 31a so as to help the heated cooling air 41 to move upwardly.

Figure 3:
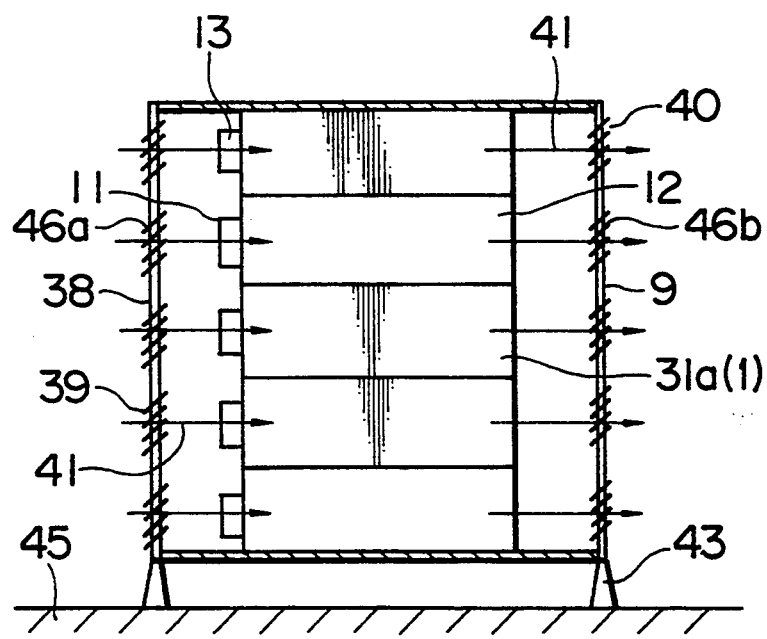
FIG. 3 is a side sectional view of another embodiment of magnetic disk storage system shown in FIG. 1.

FIG. 3 is a side sectional view showing another embodiment of the casing 9. The cooling air 41 flows into the system horizontally through inlets 39 of downward louver windows 46a on the front surface of the door 38, passes through the ducts in the respective disk units 31a, cools the magnetic disk drives 1 and so forth in the disk units 31a, and then, is released out of the casing 9 horizontally through outlets 40 of upward louver windows 46b. Although the choice between the cooling methods (flow courses of the cooling air 41) illustrated in FIGS. 2 and 3 is determined by a location and restricting conditions of the casing 9, these two methods can be combined. For instance, the air flows into the system horizontally through the inlets 39 of the downward louver windows 46a on the front surface of the door 38, and finally, it gathers and moves upwardly in the collecting duct 44 so as to be released out of the casing 9 through the outlet 40 at the top of the casing 9. Needless to say, the inlet 39 formed at the bottom of the door 38 and casing 9 may be used in combination with the inlets 39 of the downward louver windows 46a on the side of the door 38.

Figure 4:
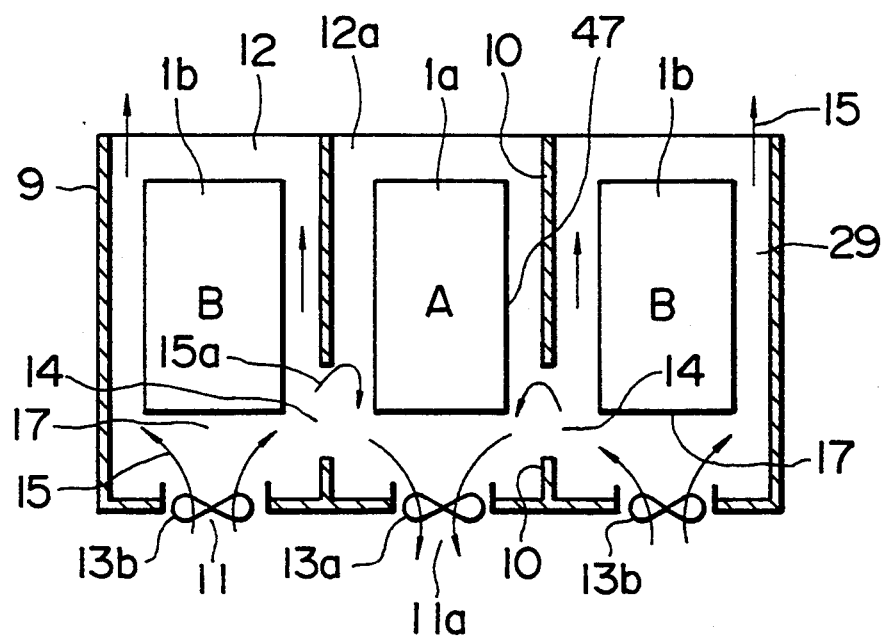
FIG. 4 is a sectional view showing another embodiment of a magnetic disk storage system according to the invention.

The function of the invention will now be described with reference to FIG. 4 and the following drawings. FIG. 4 is a sectional view showing a portion of a casing of a magnetic disk storage system according to one embodiment of the invention. One casing 9 contains three magnetic disk drives 1, and partitions 10 for forming ducts are provided between the magnetic disk drives 1. Each duct is formed with an inlet 11 and an outlet 12 of cooling air, and a blower fan 13, which is one example of blast means, is provided in the inlet 11. Other than the inlet 11 and the outlet 12, each partition 10 is formed with openings 14 through which cooling air can be passed between two adjacent magnetic disk drives 1. In the embodiment illustrated in the drawing, each magnetic disk drive 1 includes a fan 13, and the openings 14 are formed in the vicinity of those portions of a housing 47 against which cooling air is directly blown from the fan 13.

Supposing that all the fans 13a, 13b are normally functioning now, pressures of cooling air flows 15 passing the magnetic disk drives 1a, 1b will have a uniform distribution from the inlet 11a to the outlet 12a. Therefore, even if the ducts 10 include the openings 14, the cooling air flows 15 will not leak from the adjacent magnetic disk drives 1 by way of these openings 14. For this reason, when all the fans 13 are normally rotating, the above-described structure of the casing 9 enables cooling of the magnetic disk drives 1 to be conducted effectively without causing troubles, thereby suppressing their temperature rises.

Next, a speculation will be given to the case where a fan 13a is out of order or stopped. When two fans 13b are normally functioning, the cooling air flows 15 produced by the fans 13b are blown against the magnetic disk drives 1b, to thereby cool the magnetic disk drives 1b effectively. Accordingly, the pressure in an air flow receiving portion 17 at the outlet side of each of the fans 13b becomes higher than that in the environment. As a result, a part 15a of the air flow 15 produced by the fan 13b passes through the opening 14 according to the invention and reaches the magnetic disk drive 1a whose fan 13a is faulty or ceases operation. However, if the pressure drop in a direction from the opening 14 toward the inlet 11a of the fan 13a is smaller than that in a direction toward the outlet 12a (if the air flow resistance in the direction toward the outlet 12a is larger), the part 15a of the air flow 15 which has reached the magnetic disk drive 1a flows toward the fan 13a. Nevertheless, the magnetic disk drive 1a is partially exposed to the part 15a of the air flow 15. Consequently, the magnetic disk drive 1a whose fan 13a is out of order or stopped is cooled by the air flow 15a so as to prevent its temperature from rising abnormally. In the case where the openings 14 are not formed (as in the prior art), there is no way to cool the magnetic disk drive 1a, so that its temperature rise will make it impossible to read data or conduct such operation.

Figure 5:
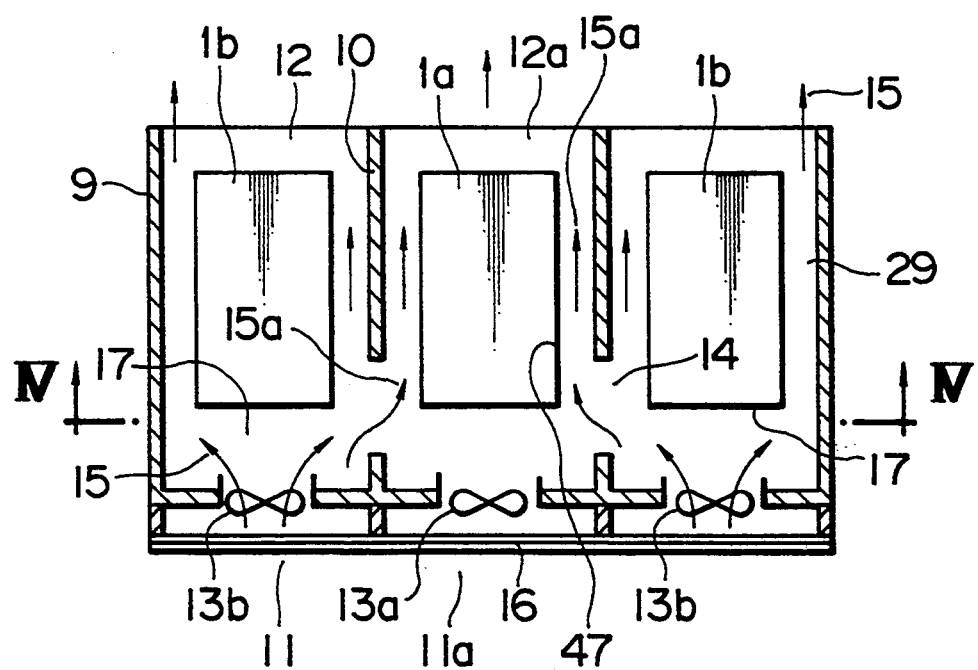
FIG. 5 is a sectional view showing a still other embodiment of a magnetic disk storage system according to the invention.

FIG. 5 shows a still other embodiment in which an air filter 16 for removing the dust is provided on the inlet side of the fans 13. This air filter serves as one of the resistances of the flows. More specifically, the pressure drop in the direction from the opening 14 toward the inlet 11a becomes larger than that in the direction toward the outlet 12a (the air flow resistance in the direction toward the outlet 12a becomes smaller), and the part 15a of the air flow 15 which has reached the magnetic disk drive 1a flows along the housing 47 of the magnetic disk drive 1a toward the outlet 12a. In this case, the cooling efficiency is better than that of the embodiment shown in FIG. 4, further suppressing a temperature rise of the magnetic disk drive 1a whose fan 13a is faulty or ceases operation. Reference numeral 29 denotes a passage in which the cooling air flows. In order to provide a resistance for regulating the pressure drop (air flow resistance), there may be employed, for example, a method of forming the air flow receiving portions 17 at the outlet side of the fans 13 in a suitable shape, a method of controlling the width of the passages 29, or the like instead of the method of using the air filter 16 for removing the dust.

Figure 6:
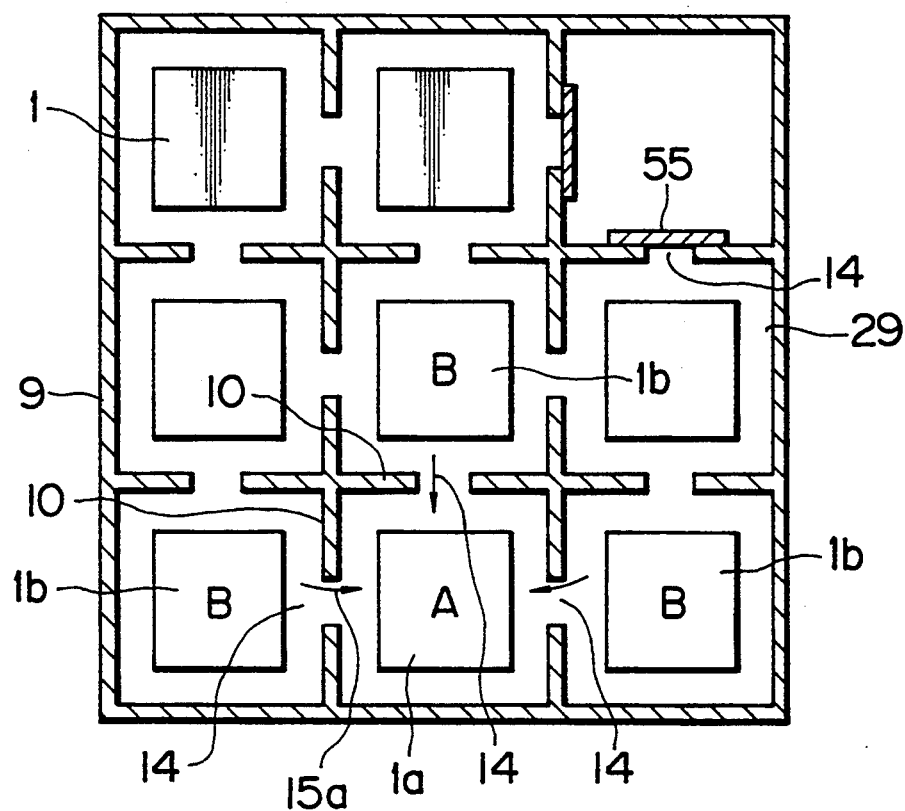
FIG. 6 is a sectional view taken along the line IV—IV of FIG. 5.

FIGS. 4 and 5 show the embodiments having an arrangement of three magnetic disk drives 1 in one layer. FIG. 6 illustrates one embodiment comprising magnetic disk drives piled in three layers and arrayed in three rows. This is equivalent to a sectional view taken along the line IV—IV of FIG. 5. Of course, the number of layers and the number of rows are not limited to these, and they may be larger. In this embodiment, vertical and horizontal partitions 10 each has an opening 14. For instance, if a fan 13a of a magnetic disk drive 1a indicated by A is stopped, a part 15a of the air flow 15 produced by each of the normally functioning fans 13b of three magnetic disk drives 1b indicated by B which are adjacent to the disk drive 1a flows toward the magnetic disk drive 1a and cools it. Needless to say, openings may be only formed in either vertical or horizontal partitions 10.

Figure 7:
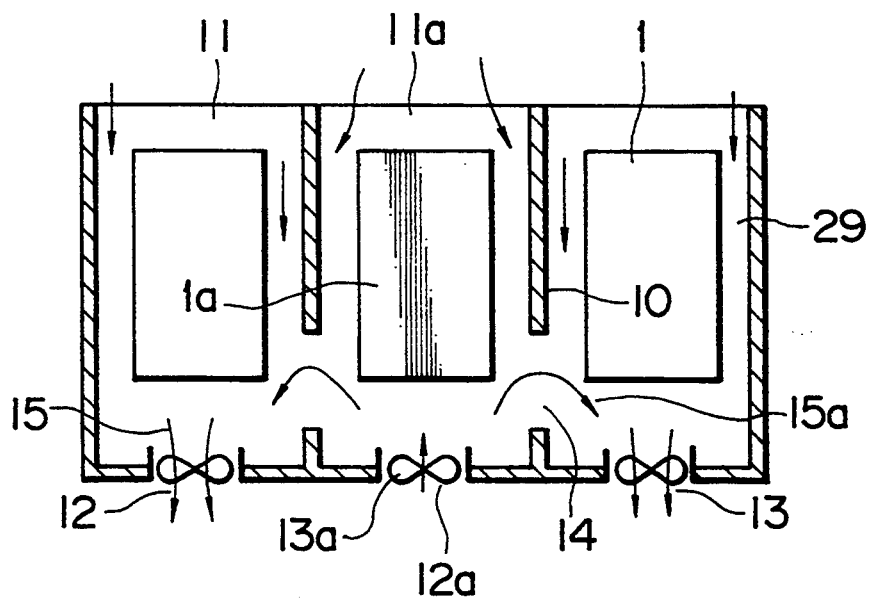
FIG. 7 is a sectional view showing a different embodiment of a magnetic disk storage system according to the invention.

FIG. 7 illustrates one embodiment in which the cooling air flows 15 are reversed. In this embodiment, suction fans 13 are provided as blast means. Although the positions of the inlets 11 and the outlets 12 are, of course, reverse to those shown in FIG. 4 and so on, the same function and effect as described before can be obtained due to the openings 14 formed in the partitions 10. FIG. 7 similarly shows a condition in which the fan 13a of the magnetic disk drive 1a is stopped. In this case, a temperature rise of the magnetic disk drive 1a can be suppressed due to the effect of the invention.

Figure 8:
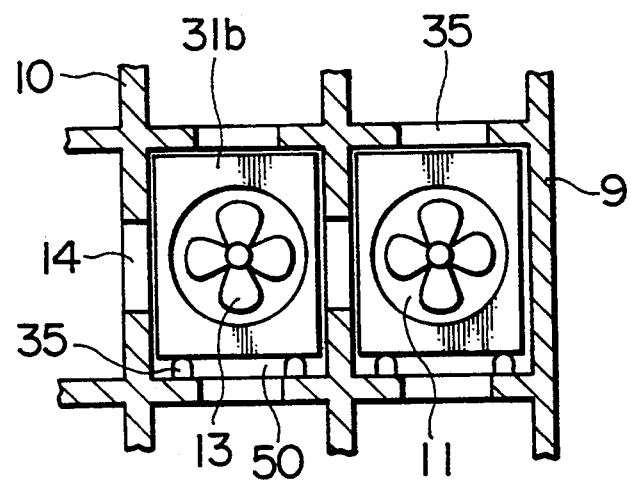
FIG. 8 is a front sectional view partially showing a state in which magnetic disk units are provided in a system casing.
Figure 9:
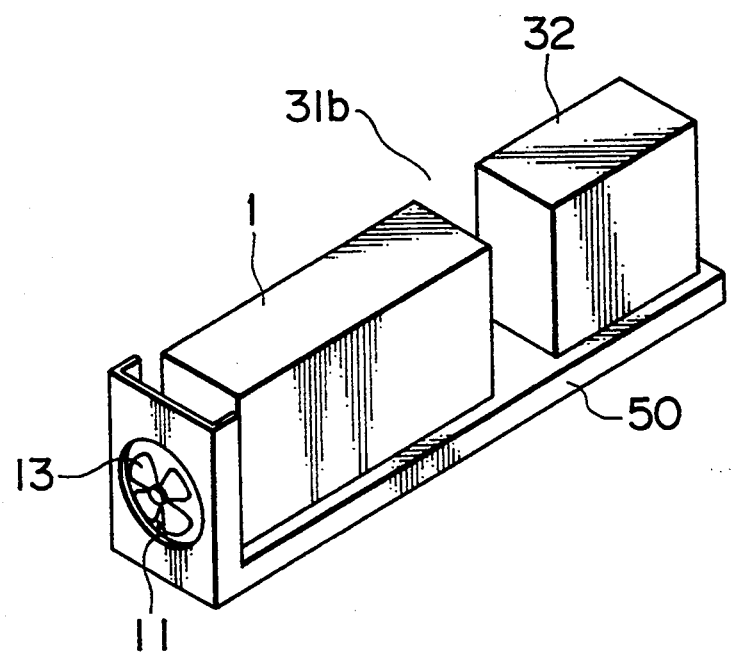
FIG. 9 is a perspective view of a magnetic disk unit with a frame structure in place of a partition.

Next, one embodiment of magnetic disk units with the magnetic disk drives 1 provided in the casing 9 shown in FIG. 6 will be described with reference to FIGS. 8 and 9. FIG. 8 is a front sectional view partially showing magnetic disk units provided in the casing. Partitions 10 for partitioning a plurality of disk units 31b individually are formed, in advance, in the casing 9 regularly and separately from the disk units 31b, and each of the partitions 10 is formed with openings 14 through which cooling air 41 can be passed. Then, the plurality of disk units 31b are installed separately between the partitions 10. FIG. 9 is a perspective view of each of such disk units 31b which is constituted of a magnetic disk drive 1, a blower fan 13 serving as blast means for the magnetic disk drive 1, and a frame 50 for sustaining them. It is different from a disk unit 31a which will be described later referring to FIG. 10 in that the disk unit shown in FIG. 9 has no partitions forming a duct. In the embodiment illustrated in FIG. 9, a drive power source and a control circuit board 32 are added at the downstream side of the disk unit 31b. However, they may be cooled separately (in such a case, each disk unit 31b only comprises a magnetic disk drive 1 and a blower fan 13).

A different embodiment of the invention will be described with reference to FIGS. 10 and 11. In this embodiment, partitions are simplified, and each magnetic disk unit is provided in a duct 2. That is to say, the duct 2 of a disk unit 31a surrounds four peripheral sides of a magnetic disk drive 1 and serves as partitions 10. Other than an inlet 11 and an outlet 12 of cooling air, the duct 2 is formed with openings 14 through which cooling air can be passed between adjacent magnetic disk drives. Each of the surfaces of the duct 2 (four surfaces corresponding to partition 10 except the surfaces which include the inlet 11 and the outlet 12) includes one opening 14. Needless to say, two or more openings may be formed in each surface, and the openings will not be restricted to a rectangular shape and can have a desired shape such as a circular one. In this embodiment, one portion of the duct 2 serving as partitions surrounding four sides of the magnetic disk drive 1 may be defined by a part of a control circuit board 32 or 52b (see FIG. 19) which will be described later. For example, one surface of the duct 2 is defined by the control circuit board 32 or 52b, in which an opening 14 is also formed. In this case, the cooling air flows through a gap (passage 29) between the duct 2 and the magnetic disk drive 1. In addition to the magnetic disk drive 1, the drive power source and the control circuit board 32 for the magnetic disk drive 1 are provided in the disk unit 31a of this embodiment. Of course, only the magnetic disk drive 1 may be installed in the disk unit 31a, and the drive power source and the control circuit board 32 may be cooled in substantially the same manner as the power source, the control circuit 42 and so forth for the whole magnetic disk storage system shown in FIG. 1. One example of blast means is a blower fan 13 (a pressurized type axial-flow fan) which blows cooling air against the magnetic disk drive 1, and this blower fan is installed on the side of the inlet 11. In the drawings, a single blower fan 13 is used for each unit, but several blower fans having a small diameter may be used instead. In this manner, one magnetic disk drive 1, one duct 2, one blower fan 13 serving as blast means for the magnetic disk drive 1, and so forth constitute each disk unit 31a. When the blower fan 13 is located on the side of the inlet 11, there is an advantage that the temperature of the fan 13 can be kept low so as to maintain the fan 13 for a long duration. In general, the duration of life of a fan closely relates to its temperature, and as the temperature is higher, the bearing failure rate of the fan will be increased. Consequently, when the fan 13 is located behind the magnetic disk drive 1, the drive power source and the control circuit board 32 (on the side of the outlet 12), the temperature of the cooling air 41 is raised due to waste heat from these heat sources, and the temperature of the fan 13 is also raised, thereby increasing the bearing failure rate of the fan 13. When the blower fan 13 is located on the side of the inlet 11, the pressure in the disk unit 31a becomes higher than that in the environment, and in the case where an air filter or the like is provided on the side of the inlet 11, there is an advantage that the dust will not enter the inside of the disk unit 31a. On the other hand, when the suction fan 13 (a suction type fan) is located on the side of the outlet 12, the pressure in the disk unit 31a becomes lower than that in the environment, and if the unit has an unnecessary gap other than the inlet 11, there is a disadvantage that the dust will easily enter inside of the unit through the unnecessary gap even if an air filter or the like is provided on the side of the inlet 11.

Figure 11:
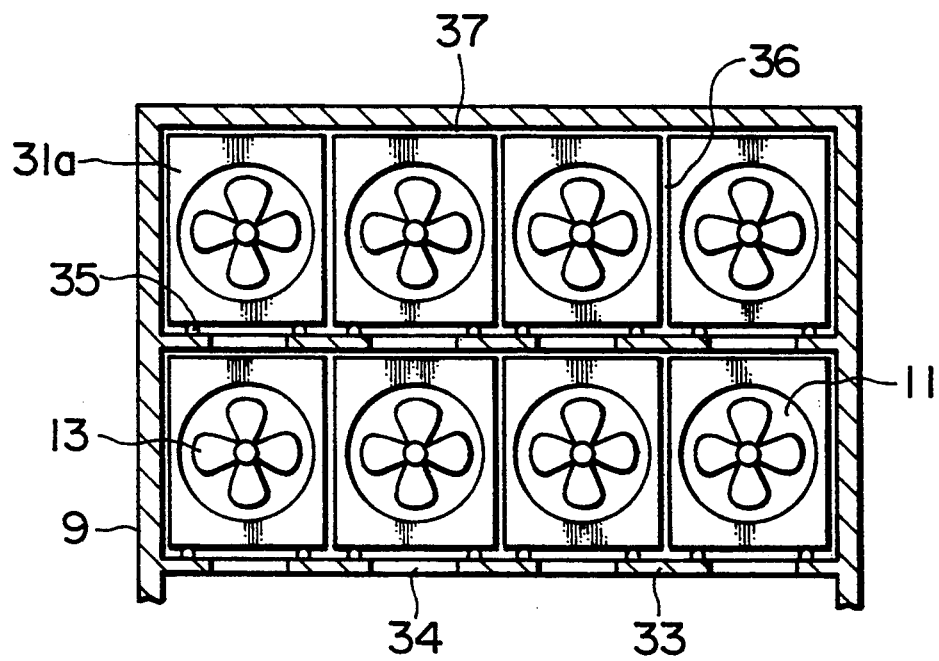
FIG. 11 is a front sectional view showing a state in which magnetic disk units shown in FIG. 10 are provided in the system casing.

FIG. 11 is a front sectional view partially showing one embodiment of the casing 9 for a magnetic disk storage system in which a plurality (eight in the drawing) of the above-described disk units 31a are provided. Frames 33 for separating the plurality of disk units 31a are formed in the casing 9. Adequate openings 34 are formed in the frames 33 so that cooling air can pass through them. Although only the frames 33 extending horizontally are shown in the drawing, vertical frames for reinforcement and so forth may be added. On an upper portion of each horizontal frame 33, there are provided rails 35 long in depth which enable smooth installation of each disk unit 31a. In this case, wheels or the like may be attached to the bottom of the disk unit 31a. By sliding the disk unit 31a on the rails 35, it can be installed in the casing 9. After the installation, fixing of the disk unit 31a is conducted reliably by stoppers, screw fasteners and the like. In the drawing, four disk units 31a are mounted on one horizontal frame 33, and two rails 35 are provided for each disk unit 31a. However, it goes without saying that the number of disk units and the number of rails will not be limited to these.

Figure 10:
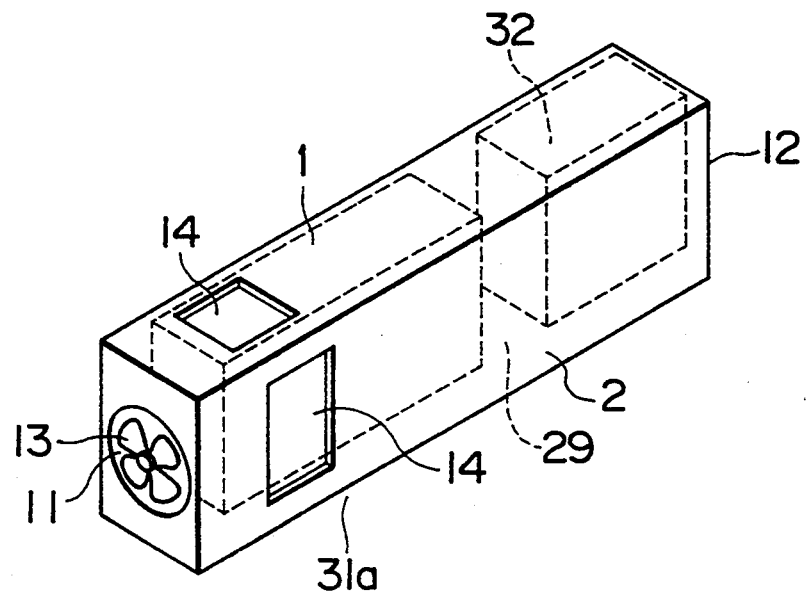
FIG. 10 is a perspective view of a magnetic disk unit with a partition.

Since the openings 14 are formed in the ducts 2 of the four disk units 31a shown in FIG. 10 which are mounted on the horizontal frame 33, it is necessary to align the positions of the openings 14 of the disk units 31a so that the cooling air can be passed between adjacent disk units 31a. It is also necessary to prevent the cooling air from leaking out of the ducts 2 through gaps 36 between adjacent openings 14. Therefore, elastic members may be attached to the peripheries of the openings 14 to thereby bring adjacent openings 14 into favorable contact. Concerning the disk units 31a which are located on ends (in contact with outer frames of the casing 9), it is not necessary to form an opening 14 in the surface of the duct 2 which is adjacent to no disk unit 31a. In the case where the openings 14 are inevitably formed in all the surfaces of each duct 2 for the sake of productivity and so forth, cover plates may be provided later to cover unnecessary openings 14, or the duct 2 and the outer frames of the casing 9 may be arranged to have no gaps 37 therebetween, or the gaps 37 may be made as narrow as possible, in order to increase the passage resistance of the air flow and to prevent the leakage thereof.

Figure 12:
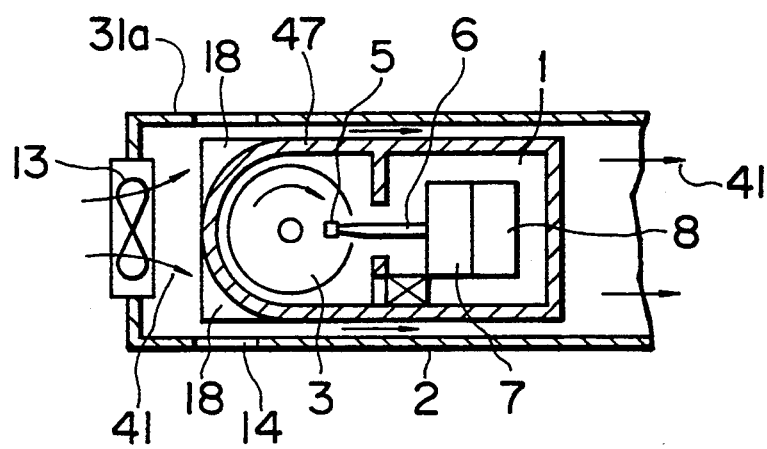
FIG. 12 is a longitudinal sectional view of a magnetic disk drive.
Figure 13:
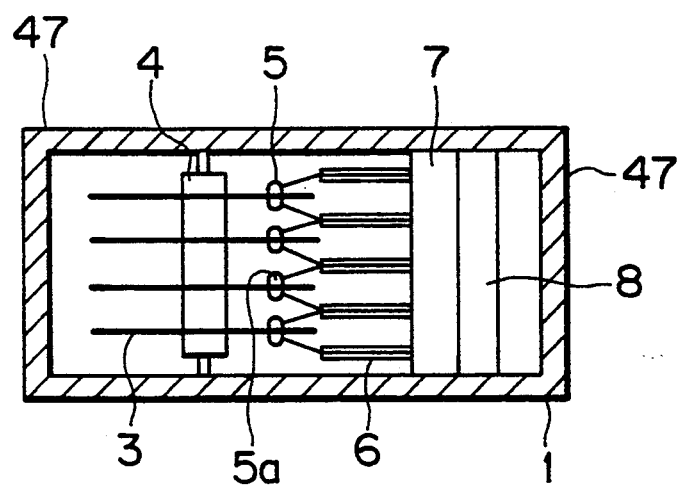
FIG. 13 is a vertical sectional view of the magnetic disk drive.
Figure 14:
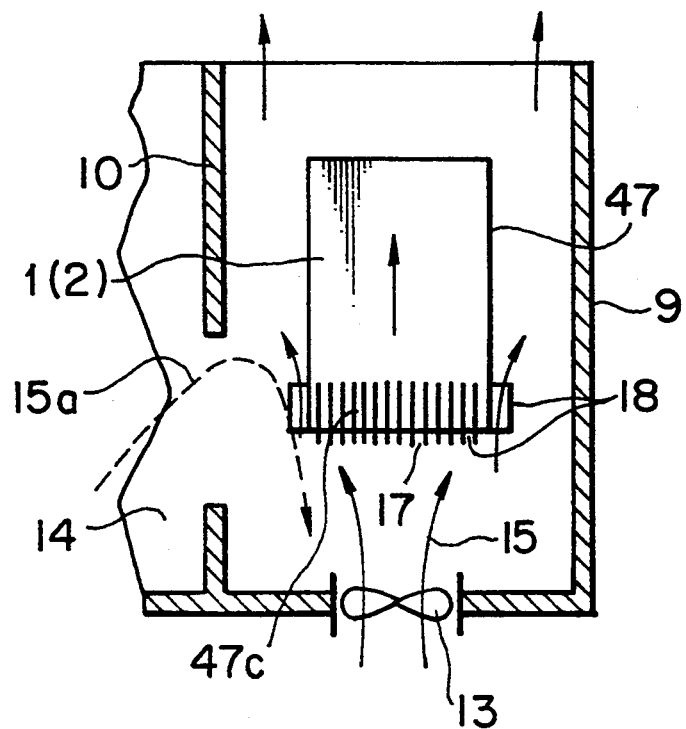
FIG. 14 is an explanatory view of a magnetic disk drive including radiation fins.

FIG. 12 is a longitudinal sectional view partially showing one embodiment of the disk unit 31a and magnetic disk drive 1 shown in FIG. 10, and FIG. 13 is a vertical sectional view showing an essential portion of the magnetic disk drive 1, taken along the axial line. With these drawings, a structure of the magnetic disk drive 1 will be described schematically. The magnetic disk drive 1 is hermetically sealed in a housing 47 to shut out the environmental air. Inside of the housing 47, a plurality of piled magnetic disks 3 for storing information rotate at high speed about a spindle 4. Magnetic heads 5 for reading and writing information of the magnetic disks 3 are provided on the distal ends of a large number of head arms 6, and the head arms 6 gain access to the magnetic disks 3 at high speed through a carriage mechanism 7 which is actuated by a voice coil motor 8, so that the magnetic heads 5 will be located accurately at predetermined positions on the magnetic disks 3.

A magnetic disk storage system has two types of arrangement for positioning control. One is a dedicated servo method the system of which includes a large number of data surfaces and an exclusive servo surface on which positioning information is stored, and positioning control is constantly performed on the basis of servo information of the servo surface. The other is an embedded servo method the system of which does not include any exclusive servo surface for positioning information but positioning information is stored on a part of a data surface, and positioning control is performed on the basis of servo information of the data surface. The cooling method according to the invention is effective particularly for a magnetic disk storage system of the dedicated servo method for positioning control for the following reason: In the dedicated servo method, as shown in FIG. 13, for example, a single servo head 5a conducts positioning control of a large number of data heads (heads except the head 5a), and consequently, if a temperature rise of the magnetic disk drive 1 or a difference in a temperature distribution of the magnetic disk drive 1 is large, a thermal expansion difference is generated between the magnetic disks 3 or between the head arms 6, thus deteriorating the positioning accuracy.

The magnetic disk drive 1 is not necessarily restricted to the structure shown in FIGS. 12 and 13. For example, although the magnetic heads 5 and the carriage mechanism 7 of this embodiment are of a linear type for linear movements, they may be of a swing type for arcuate rotations. The number of the magnetic disks 3 may be either one or plural. Moreover, the diameter of each magnetic disk 3 may be as large as 8 to 10 inches or more, and it may be as small as 5.25, 3.5, 2.5, 1.8 inches and so on. Further, the magnetic disks 3 may be arranged vertically (the spindle is extended horizontally) as shown in FIG. 12, and they may be arranged horizontally (the spindle is extended vertically).

The above-described openings 14 through which the cooling air 41 can be passed are formed in those portions of the duct 2 which are adjacent to the surfaces of the housing 47 of the magnetic disk drive 1. Under the circumstances, the temperature of the magnetic disk drive 1 is raised owing to a wind loss by rotations of the magnetic disks 3, a loss by resistances of a large number of head arms 6, heat generated in the voice coil motor 8, and so forth, Therefore, cooling of the magnetic disk drive 1 is an indispensable factor for improving the reliability.

FIGS. 14 to 18 show embodiments in which fins are formed on the magnetic disk drive 1 so as to enhance the cooling effect.

Figure 15:
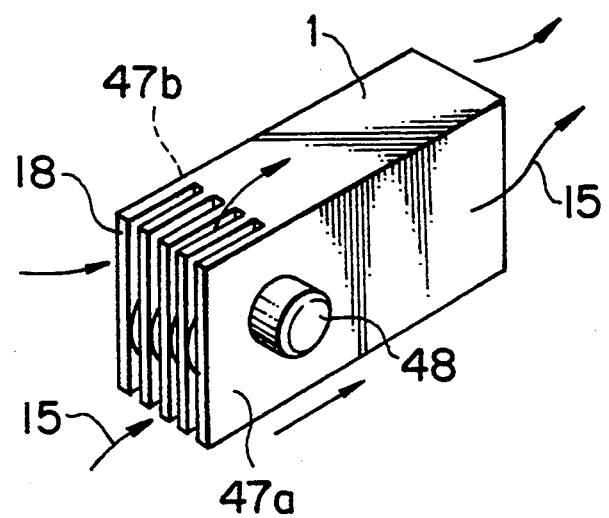
FIG. 15 is a perspective view of a magnetic disk drive including radiation fins.

In order to improve the cooling efficiency, a jet of cooling air 15 having whirling components produced by the blower fan 13 is directly blown against a front surface 47c of the housing 47 of the magnetic disk drive 1, and this portion of the magnetic disk drive 1, which is suitable for heat transfer, is provided with a large number of radiation fins 18. Especially when the portion suitable for heat transfer is located on the side of a disk chamber containing the magnetic disks 3, as shown in FIG. 12, remarkably favorable heat transfer is realized inside of the housing 47 because the magnetic disks 3 are rotating at high speed in the disk chamber inside the housing 47. Highly favorable heat transfer is also realized outside of the housing 47 by jet cooling and the radiation fins 18 described above. As a result, the overall coefficient of heat transmission (which is an inverse of a thermal resistance) is significantly increased. Therefore, highly effective cooling can be carried out, thereby reducing largely a temperature rise of the magnetic disk drive 1. An example of the configuration of the radiation fins 18 is shown in FIG. 15 which is a perspective view of the magnetic disk drive 1, and as in this example, the radiation fins 18 may be formed of several (five in the drawing) thin plate-like fins. Further, the radiation fins 18 should preferably be made of a material having a high thermal conductivity. In the case where they are integrally formed with the housing 47, an aluminum material (such as an aluminum alloy and an aluminum casting) is suitable. In the above-described embodiment, the radiation fins 18 are formed only on the front surface 47c of the housing 47 of the magnetic disk drive 1 against which the cooling air jet 15 is directly blown. After that, however, the cooling air 15 naturally flows along the housing 47 of the magnetic disk drive 1 toward the back, and consequently, radiation fins 18 may be formed additionally on all the other surfaces or necessary portions of the housing 47, to thereby improve the cooling efficiency to a further extent. Also, the configuration of these radiation fins 18 may be arranged in such a manner that they also function as reinforcement ribs or the like of both side surfaces (47a, 47b) of the housing 47 which sustain the spindle portion of the magnetic disk drive 1.

Referring again to FIG. 15, reference numeral 48 denotes a motor for driving the magnetic disks 3, and in this embodiment, the motor 48 is directly connected to the tip of one end of the spindle. With this structure, heat is generated in the motor 48 due to its loss, so that a temperature difference will be easily generated between the housing surface 47a on which the motor 48 is provided and the opposite housing surface 47b with no motor. In this case, favorable heat transfer can be realized by making the area of the radiation fins 18 formed on the housing surface 47a with the motor 48 larger than that on the opposite housing surface 47b with no motor, or alternatively, by making the flow velocity of the cooling air flowing on the housing surface 47a with the motor 48 higher than that on the opposite housing surface 47b with no motor. Also, both the methods may be combined.

Figure 16:
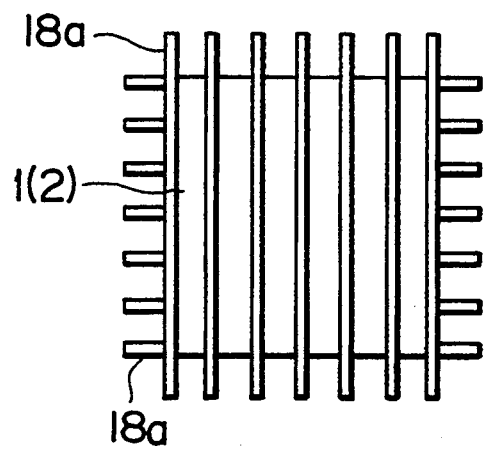
FIG. 16 is an explanatory view of linear radiation fins.
Figure 17:
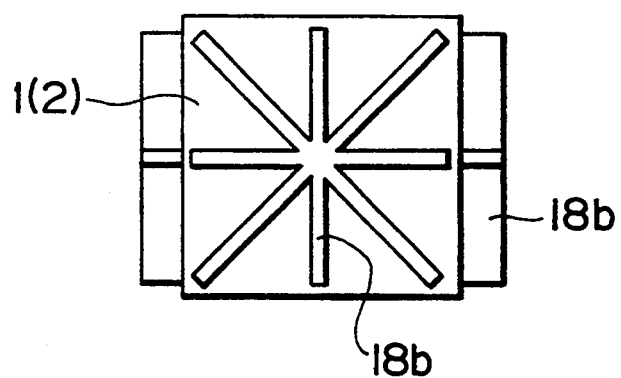
FIG. 17 is an explanatory view of radial radiation fins.
Figure 18:
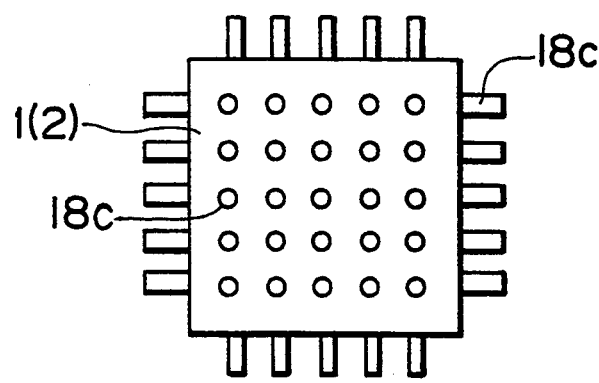
FIG. 18 is an explanatory view of pin-like radiation fins.

FIGS. 16 to 18 show other configurations of fins, as viewed in a direction from the blower fan.

Referring to FIG. 16, linear fins 18a are arranged in parallel and provided on the receiving portion 17 of the air flow from the blower fan 13 and in its vicinity. The linear fins 18a may be further divided into thinner fins and may be arranged in a zigzag or stagger form. Referring now to FIG. 17, linear fins 18b are arranged in a radial form and provided on the air flow receiving portion 17 from the fan 13. The air from the fan 13 flows along the linear fins 18b in the radial form toward the outer periphery. The radiation fins 18b in the radial form need not be linear toward the outer periphery, but they may be curved with a certain curvature in a direction of the air flow blown from the fan 13. FIG. 18 illustrates a large number of pin-like fins 18c which are provided on the air flow receiving portion 17. Although the pin-like fins 18c perform remarkably favorable heat transfer, it is necessary to arrange them rather densely so as to increase the radiation area. For example, extremely thin (1 mm or less) pin-like fins 18c are manufactured and arranged densely on the housing 47. The cross-sectional shape of the pin-like fins 18c need not be circular, but it may be oval, rectangular, and so forth.

In order to improve the cooling efficiency (radiation efficiency) to a further extent, there is a method of generating whirling flows by disturbing flows of the cooling air 41 passing along the magnetic disk drive 1 in the duct 2. This method requires means generally called a turbulence promoter, and the above-described radiation fins 18 can be used as they are. As a different means, a large number of small projections and uneven portions may be formed on inner walls of the duct 2. These projections and uneven portions may be manufactured by adhering a foreign material on the duct 2 by an adhesive or the like in the post-treatment after finishing the duct 2, or by blowing sand or the like against the inner walls of the duct 2 by use of the sand blast so as to make them rough, or by forming the projections and uneven portions integrally with the duct 2 in a method of pressing, mechanical machining, or the like. In the case where the drive power source, the control circuit board 32 and so forth are added to the disk unit 31a, such projections and uneven portions and the like should preferably be formed similarly on inner walls of the duct 2 in the vicinity of them.

Figure 19:
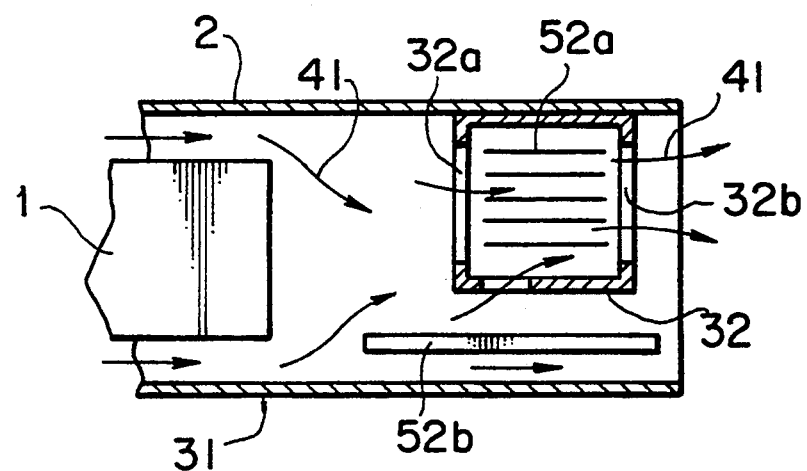
FIG. 19 is a top sectional view illustrative of a method of cooling a power source and circuit boards.
Figure 20:
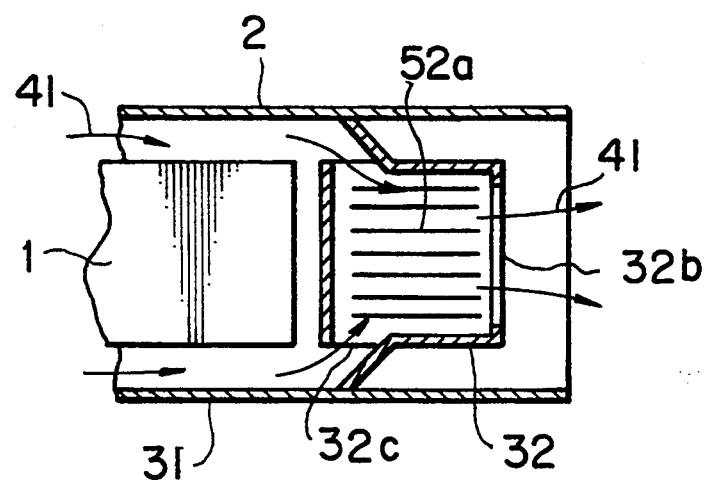
FIG. 20 is a top sectional view illustrative of another method of cooling a power source and circuit boards.

FIGS. 19 and 20 show embodiments of cooling methods of the drive power source and the control circuit board 32 in the case where the drive power source and the control circuit board 32 are added, for example, to the respective disk units 31a and 31b shown in FIGS. 9 and 10. Reference numerals 52a and 52b denote an example of a circuit board provided inside a container box of the drive power source and the control circuit board 32 and an example of a circuit board provided outside the container box. When the magnetic disk drive 1 and the container box of the drive power source and the control circuit board 32 can be arranged at a sufficient distance from each other in the duct 2, as shown in FIG. 19, openings for passing the cooling air 41 are formed in a front surface portion 32a and a back surface portion 32b of the container box so that the cooling air 41 which has cooled the magnetic disk drive 1 flows inside the container box. In this case, the circuit boards 52a and 52b provided inside and outside the container box are extended neatly along the cooling air flow. On the other hand, when the distance between the magnetic disk drive 1 and the container box of the drive power source and the control circuit board 32 is not enough, as shown in FIG. 20, inlets through which the cooling air 41 is forcibly introduced into the container box are formed in side-surface front portions 32c of the container box rather than the front surface portion 32a, and outlets are formed in the back surface portion 32b. In such a case, the circuit boards 52a provided inside the container box may be arranged in such a manner that front end portions of them are gradually shortened from the center toward the side ends of the container box, as shown in the drawing. Thus, each of the boards 52a can be effectively cooled by the cooling air 41. In some cases, the drive power source and the control circuit board 32 may be exposed like, for example, the circuit board 52b, instead of being provided inside the container box. In these cases, it is, of course, necessary to pay much attention to the insulation and so on.

Figure 21:
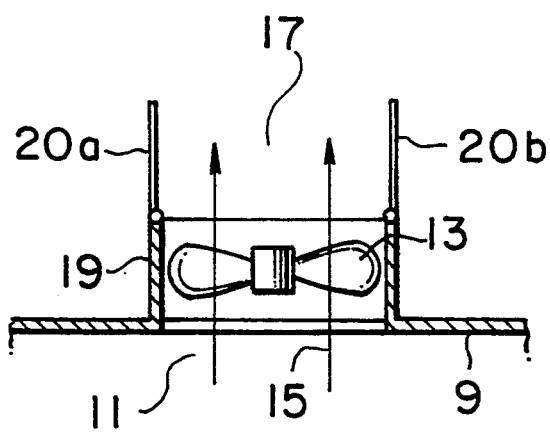
FIG. 21 is an explanatory view of a fan provided with opening/closing means when they are opened.
Figure 22:
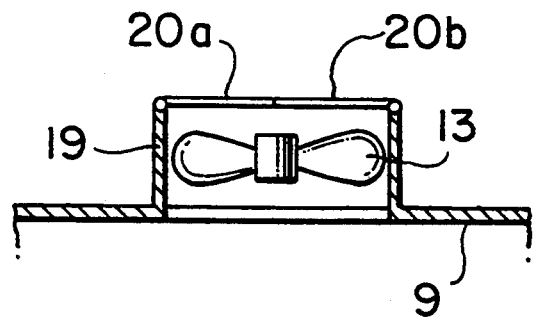
FIG. 22 is an explanatory view of the fan provided with the opening/closing means when they are closed.

FIGS. 21 and 22 only illustrate the fan 13 of FIG. 4 and its vicinity, showing one embodiment for forcibly controlling the cooling air flow 15 at the time of stoppage of the fan 13. Each of the fans 13 is provided with a fan guide 19 and a damper 20 which is provided on the fan guide 19, respectively, so as to function as opening/closing means for controlling the cooling air flow 15. FIG. 21 shows a condition when the fan 13 is normally rotating, in which damper sections 20a and 20b are pushed open due to a pressure of the air from the fan 13 (open condition). On the other hand, FIG. 22 shows a condition when the fan 13 is out of order or stopped, in which the damper sections 20a and 20b are closed owing to their resilient forces (closed condition). Springs or the like are used to produce the resilient forces. Such opening/closing means (damper 20) take the following effect. For instance, referring to FIG. 4, when each of the fans 13 is normally rotating, the damper 20 is in the open condition, and the cooling air flow 15 from the fan 13 moves from the inlet 11 to the outlet 12 along the housing 47 of the magnetic disk drives 1. In this case, there are no flow interferences between the magnetic disk drives 1. If the fan 13a falls into trouble or ceases operation, the damper 20 of the fan 13a is in the closed condition owing to its resilient force (while the other fans 13 are in the open condition). After a part 15a of the air flow 15 from each of the adjacent fans. 13b flows to a receiving portion 17a of the air from the fan 13a, it can not pass through the fan 13a which is out of order or stopped, and consequently, it is forcibly moved in the opposite direction toward the outlet 12a. In short, the damper 20 serves as an air flow resistance of the flow similar to the air filter 16 for removing the dust, shown in FIG. 5. Since the resistance of the damper 20 is larger, the effect of it is accordingly larger. Although the damper 20 shown in FIGS. 21 and 22 is opened/closed by use of the air pressure generated by the fan 13, there is another method in which on and off states of operation of the fan 13 are detected, and the damper 20 is forcibly opened/closed in response to the detection output. In this case, however, a driving force is required. Moreover, although the damper 20 shown in FIGS. 21 and 22 is divided into two sections (20a, 20b), it may be divided into three or more. Furthermore, the opening/closing means are not necessarily limited to the damper 20 shown in FIGS. 21 and 22.

Figure 23:
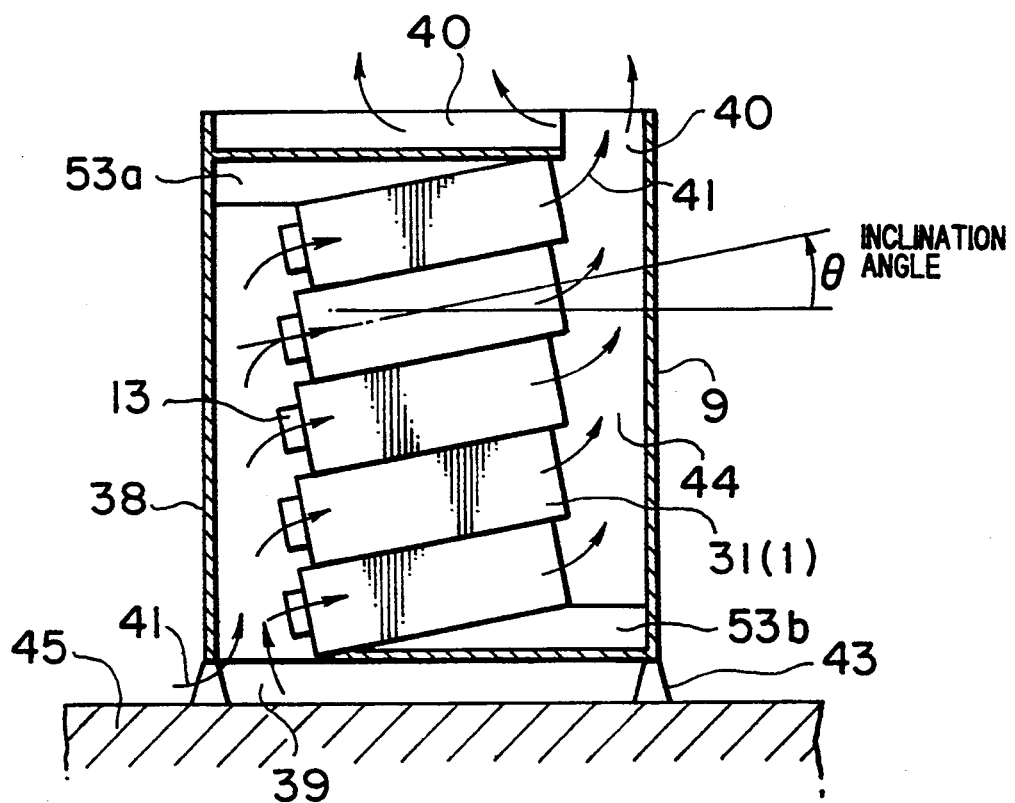
FIG. 23 is a side sectional view showing a state in which magnetic disk units are inclined and provided in a system casing.

FIG. 23 is a side sectional view showing a condition in which the disk units 31 are provided (cooled) in the casing 9 according to one embodiment of the invention. Although the disk units 31 are placed horizontally in FIGS. 2 and 3, each disk unit 31 (31a or 31b) in FIG. 23 is inclined in such a manner that its longitudinal direction (the direction of the cooling air flow) extends at an angle $\theta$ with respect to the horizontal direction. One object of this arrangement is to make the flow of the cooling air 41 smooth. Since the air heated as a result of cooling of the disk unit 31 tends to move upwardly due to a decrease in the density, a rear end portion of the disk unit 31 is lifted up to help the upward movement of the air. Although the inclination angle $\theta$ must be large to a certain degree, it is restricted by the dimensions of the casing 9 and the disk unit 31, and consequently, even slight inclination can produce some effect. Spaces 53a and 53b generated owing to the inclined arrangement can be used for storing auxiliary members and the like. The inclination angle $\theta$ may have a negative value. The reason is that, with the structure where the cooling air 41 flows in from the back of the casing 9 and flows out from the front, the cooling air 41 flows in each of the disk units 31 from the back to the front, so that it is better to lift the front portion of the disk unit 31. That is to say, the inclination angle $\theta$ may have either a positive value or a negative value so far as the inclination is directed not to interfere the flow of the cooling air 41.

Figure 24:
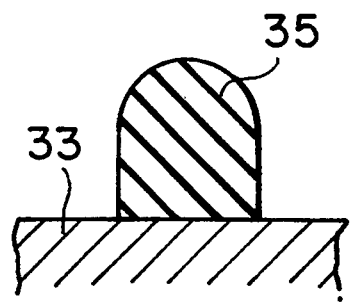
FIG. 24 is a front sectional view showing a configuration of a rail.
Figure 25:
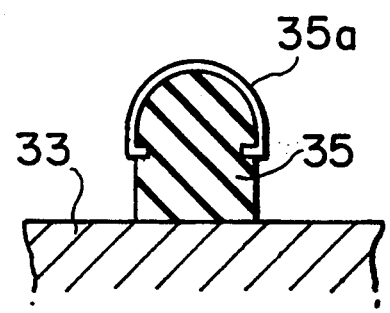
FIG. 25 is a front sectional view showing a configuration of another rail.

Next, there will be described one embodiment of the configuration of the rail 35 for installing the disk units 31 (31a and 31b) into the casing. FIG. 24 illustrates the sectional configuration of the above-described rail 35 shown in FIGS. 8 and 11, as viewed from the front. As shown in FIG. 24, a portion of the rail 35 in contact with the disk unit 31 is circular in cross section. The rail 35 is made of a single material such as a metal, e.g., an SUS (stainless steel) material, and an ethylene tetrafluoride resin (PTFE) material. The portion of the rail 35 in contact with the disk unit 31 may be rectangular or trapezoidal in cross section. The rail 35 may be made of an elastic material such as rubber so that it also functions as a shock mount for absorbing the self oscillation of the disk unit 31 and for shutting out the outside oscillation. FIG. 25 shows another embodiment of the rail 35 a main body of which is made of an elastic material such as rubber to absorb the oscillation whereas a metal plate such as a thin SUS plate 35a is provided on the surface (the contact portion with the disk unit 31). With this structure, the rail 35 not only functions as a shock mount but also helps the disk unit 31 to be smoothly received into the casing. In this case as well, the contact portion of the rail 35 may be rectangular or trapezoidal in cross section.

In the embodiments of the invention, cooling of each magnetic disk drive 1 is performed in each disk unit 31 comprising a fan 13 and a duct 2 (or a partition 10) which surrounds the magnetic disk drive 1. Therefore, when the magnetic disk drive 1 is out of order or to be inspected for maintenance, it can be taken out by removing the disk unit 31 as a minimum unit from the casing 9, so that operation of the other disk units 31 (magnetic disk drives 1) can be continued without stopping them. In this case, removal of the disk unit 31 from the casing 9 can be effected, for instance, simply by drawing it to the front (toward the door 38) in FIG. 1. It characterizes the invention significantly as well as the highly effective cooling; However, when a disk unit 31 is removed from a certain portion of the casing 9, that portion of the casing 9 becomes a vacant space, and the cooling air 41 leaks into the space through the openings 14 of the adjacent disk units 31. Consequently, it is necessary to take measures to prevent such leakage. For example, as shown in FIG. 6, if the right disk unit in the upper layer is not installed, cover plates 55 can be provided over the openings 14 of the adjacent disk units 31. In this example, two cover plates are used.

In the above-described embodiments, the blower or suction fans 13 are employed as blast means. However, in the case where cooling air having a high pressure ratio is required for a magnetic disk storage system, a system like a blower or a compressor may be provided so that compressed air produced by the system is guided through pipes, ducts and the like and distributed to the disk units 31. In this case as well, according to the invention, substantially the same effect as the fans 13 can be expected. In order to suppress a temperature rise of the magnetic disk drives 1 to a further extent, the temperature of the above-mentioned cooling air 41 produced by the fans 13 or the blower or compressor may be made lower than that of the air in the environment of the casing 9 by the cooler, and the cooling air 41 thus refrigerated may be supplied to the disk units 31. In this case, in order to prevent humidity from entering the system, the temperature of the cooling air 41 must be carefully maintained not to be lower than the dew-point temperature. Moreover, when the cooling air 41 which has finished cooling the magnetic disk drives 1 is not released from the casing 9 but collected and supplied, as it is, to the inlet of the cooler, a closed loop of the cooling air 41 can be realized, thereby further preventing the dust from entering the inside of the casing 9. If a large-sized computer or the like cooled by cooling water is provided nearby, part of the cooling water may be used as a refrigerant of the cooler, or a refrigerant of a refrigerating cycle with a heat pump and the like which is additionally provided in the magnetic disk storage system may be used as the refrigerant. The refrigerating cycle here comprises a compressor, a condenser, an evaporator (cooler to obtain cold cooling air 41), an expander, a switch valve such as a four-way valve, and pipes and the like for connecting them. As one example of the cooler, a fin-tube type heat exchanger is suitable. Heat exchange is conducted by flowing the air for cooling the magnetic disk drives 1 between the surfaces of fins and by flowing the refrigerant in the tube, to thereby obtain cold cooling air 41. As another example of the cooler, a heat pipe, a thermo electric cooler (Peltier element), and so forth can be employed. In the case where the above-mentioned refrigerating cycle is used, in order to cause the magnetic disk drives 1 to reach a predetermined temperature rapidly, the cooler may be made to function as a condenser by changing the valve (e.g., a four-way valve) in the refrigerating cycle at the time of the start of the magnetic disk drives 1, so that heated air is generated in the condenser, and that the heated air is supplied into the disk units 31 so as to raise the temperatures of the magnetic disk drives 1 quickly. When they actually reach the predetermined temperature, the valve is changed to make the cooler function as the evaporator for the original purpose. With this arrangement, the magnetic disk drives 1 can be heated in a shorter period of time than in the conventional case, and thermal off-track and so on caused during that time can be prevented, thus improving the reliability and positioning accuracy of the magnetic disk storage system.

In the various embodiments of the invention, in order to enhance the reliability, detection means for detecting operational conditions of the fans 13 (blast means) of the respective disk units 31 may be provided additionally in the system casing 9 so as to inform the user of the trouble or stoppage of the blast means 13 with output signals from the detection means when the blast means 13 are out of order or stopped.

Figure 26:
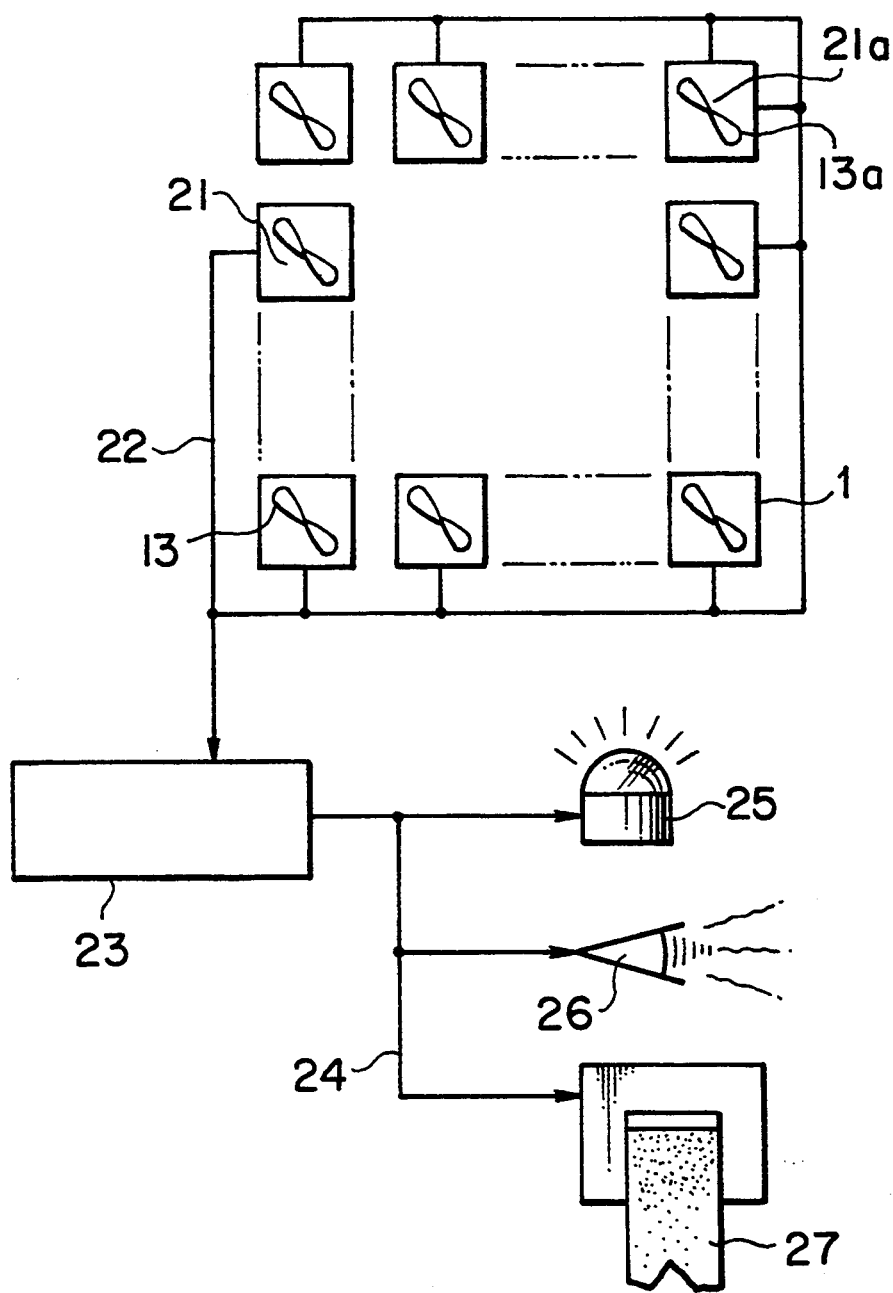
FIG. 26 is a diagram for explaining a control system for informing the user of trouble of a fan.

FIG. 26 illustrates one embodiment of this arrangement in which each fan 13 is provided with a detector 21 for detecting the operational condition of the fan 13, and its signal line 22 is connected to a control circuit 23. As the detector 21, one for detecting an electric current or power of the fan 13 can be used. When a certain fan 13a falls into trouble, the fact is detected by a detector 21a of the fan 13a, and visible or audible signals are produced via an output line 24 from the control circuit 23 so as to inform the user. As a method for informing the user, there are a method of using an indication lamp, as indicated by reference numeral 25, a method of using a speaker, as indicated by numeral 26, a method of printing, as indicated by numeral 27, and so forth. Although each of these methods may be used individually, they may be combined. Such a control method illustrated in FIG. 26 will take greater effects when it is combined with the other embodiments of the invention.

Figure 27:
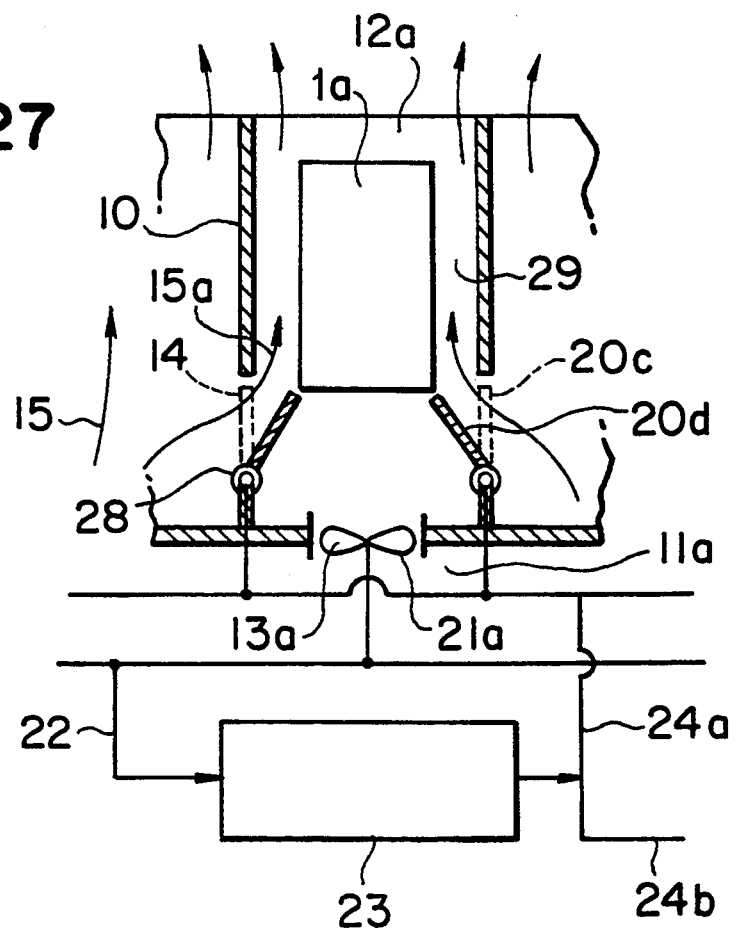
FIG. 27 is an explanatory view of a magnetic disk drive including opening/closing means.

FIG. 27 illustrates one embodiment in which stoppage detectors are applied to a magnetic disk storage system, only showing the center magnetic disk drive 1a of FIG. 4 and its vicinity. Substantially the same function can be expected from the other magnetic disk drives 1. Reference numeral 20c, 20d denotes opening/- closing means similar to the damper shown in FIG. 21, which can be swung about hinges 28. While the fan 13a is normally functioning, the damper means 20 are in the condition 20c (indicated by dashed lines), and a cooling air flow 15 generated by the fan 13a moves toward the outlet 12a. When the fan 13a falls into trouble or ceases operation, the detector 21 detects that the fan 13a is faulty, and the damper means 20, which are provided in the openings 14 of the duct-forming partition 10 of the magnetic disk drive 1a with the fan 13a, are displaced into the condition 20d (indicated by solid lines) in response to a command sent through an output line 24a of the control circuit 23, so that a part 15a of the cooling air flow 15 from each of the adjacent magnetic disk drives 1 is introduced into the duct-like passage 29. Further, simultaneously through the other output line 24b of the control circuit 23, the indication lamp 25, the speaker 26 and means for the printing 27 are operated to inform the user, as shown in FIG. 26. The damper means 20 shown in FIG. 27 serving as opening/closing means may be a sliding type instead of the swinging type.

Figure 28:
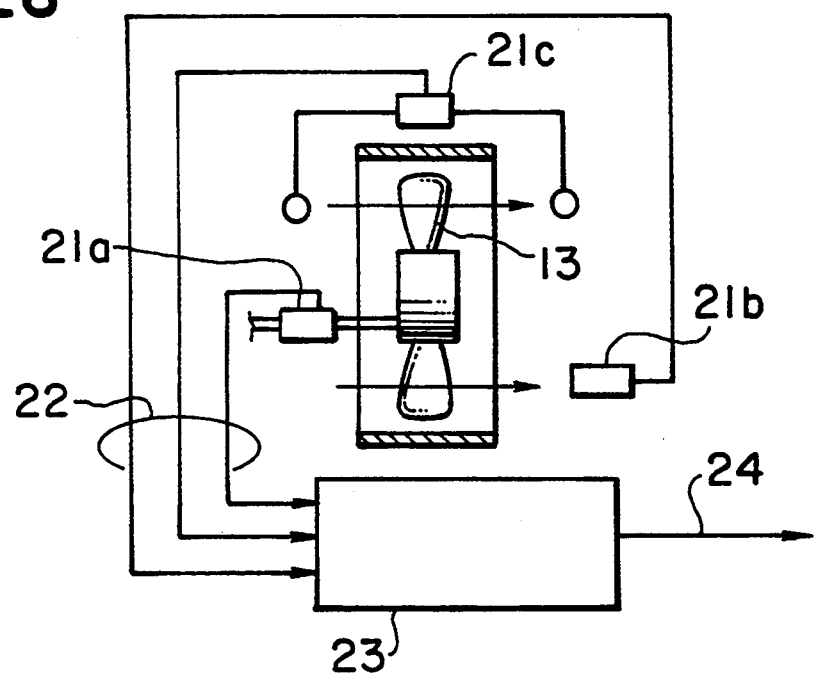
FIG. 28 is a diagram showing kinds of detectors and their installation positions.

FIG. 28 shows examples of detection methods for detecting the operational condition of the fan 13. As the detector 21, there can be suggested an ammeter 21a for detecting an electric current from a power source of the fan 13, an anemometer 21b for detecting a flow velocity in a blowing section of the fan 13, a differential manometer 21c for detecting pressures of the air in front of and at the back of the fan 13, and so on. Although each of them may be used individually, they may be combined. Their signal lines 22 are connected to the control circuit 23 so that the above-described control is carried out. Besides, even if the blast means are not the fan 13, such detection means 21 can be employed.

Moreover, the following operation can be performed With the detector 21. When there is some trouble with the fan 13 which is cooling a certain disk unit 31, the user is informed of the trouble of the fan 13 by way of the detector 21, and also, the rotational speeds of cooling fans 13 for disk units 31 adjacent to the disk unit 31 in question are controlled in response to the output of the detector so as to increase the amount of air supply. This is because, when the fan 13 is out of order or stopped, a part 15a of the cooling air flow 15 from each of the adjacent disk units 31 leaks through the openings 14 into the disk unit 31 whose fan 13 is faulty or ceases operation, and the flow amount of the cooling air 15 in the adjacent disk units 31 is accordingly decreased by the amount of the leakage if the rotational speeds of the fans 13 are constant. In order to compensate for it, it is preferred to increase the rotational speeds of the fans 13 of the adjacent disk units 31.

Figure 29:
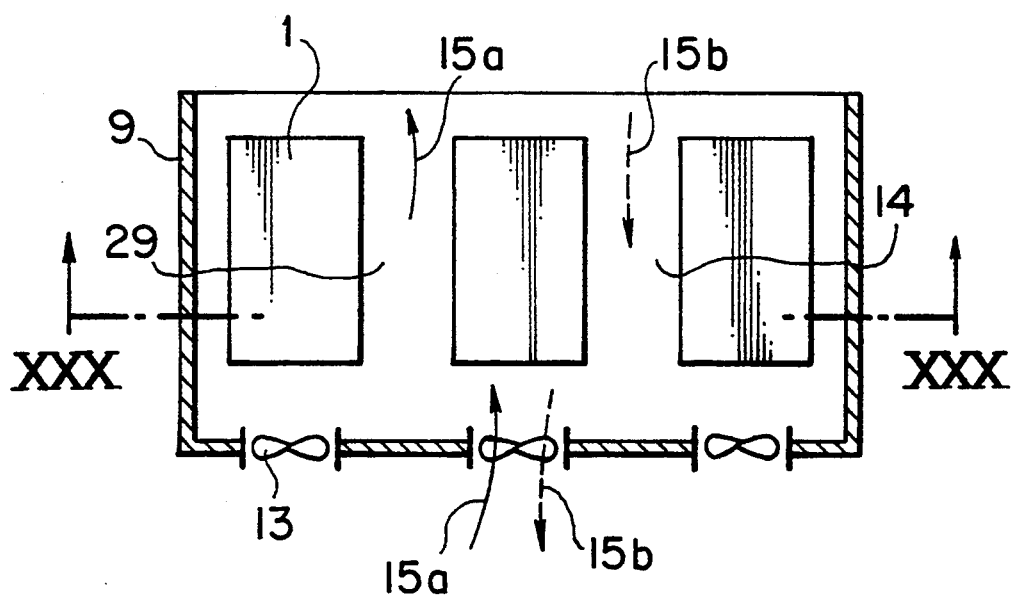
FIG. 29 is a sectional view showing another embodiment of the invention.
Figure 30:
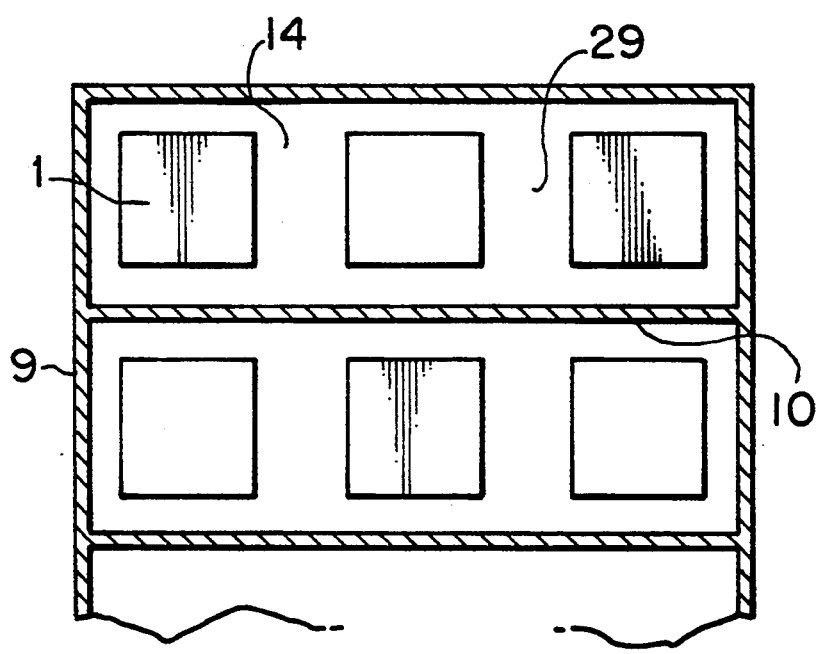
FIG. 30 is a sectional view taken along the line XXX—XXX of FIG. 29.
Figure 31:
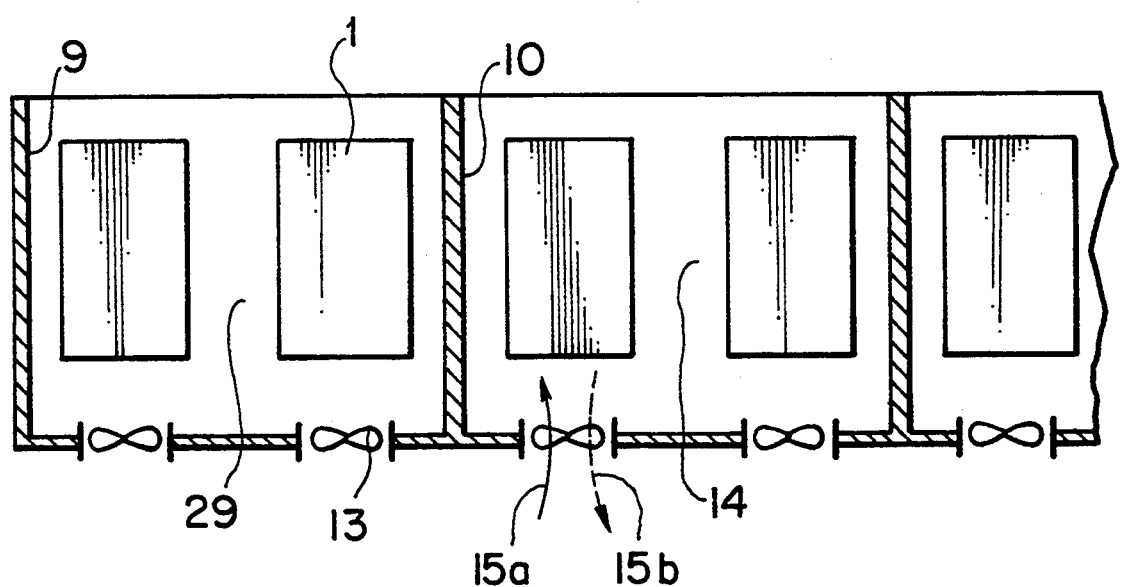
FIG. 31 is a sectional view showing a further embodiment of the invention.

FIGS. 29 to 31 show still other embodiments of the invention. FIGS. 29 and 31 are sectional views, as viewed in the same direction as the embodiment of FIG. 4, and FIG. 30 is a sectional view corresponding to FIG. 6. In the embodiment shown in FIG. 29, there are no partitions 10 between three magnetic disk drives 1 but only the openings 14 are formed therebetween. The number of magnetic disk drives 1 with no partitions 10 may be more than three. Although the number of the magnetic disk drives 1 and the number of fans 13 are the same in the drawing, they may be different in some cases. The air flow produced by the fans 13 may be either in a direction 15a (blowing) or in a direction 15b (suction). With this structure, while the three fans 13 are normally functioning, the respective magnetic disk drives 1 can be effectively cooled, and in case that one of the fans 13 falls into trouble or ceases, parts of the air flows from the other fans 13 move into the magnetic disk drive 1 whose fan 13 is faulty, thereby preventing an abnormal rise of the temperature of the magnetic disk drive 1 in question. As a further embodiment which is an intermediate between the ones shown in FIGS. 4 and 29, the openings 14 may be arranged to cover most of the spaces between the magnetic disk drives, but slight portions of the partitions 10 remain therebetween. FIG. 30 shows an example in which casings 9 according to the embodiment of FIG. 29 are piled in several layers, and the partitions 10 are provided only between the upper and lower layers (there are no partitions 10 between the magnetic disk drives in each layer but only the openings 14 are formed therebetween). Needless to say, the partitions 10 and the openings 14 may be provided in the opposite relation, or there may be provided no partitions 10 in either direction but only the openings 14 may be formed (the casing 9 may include the outer frames alone).

Furthermore, in the embodiment shown in FIG. 31, two magnetic disk drives 1 are always treated as a pair, and partitions 10 to form ducts are provided between these pairs whereas there is no partition 10 between the two magnetic disk drives 1 in each pair but only the opening 14 is formed therebetween. In this case as well, the number of the magnetic disk drives 1 and the number of fans 13 need not be the same. This embodiment produces substantially the same effect as the one shown in FIG. 29.

According to the present invention, even if blast means for a certain magnetic disk drive is out of order or stopped, a part of the cooling air from blast means for adjacent magnetic disk drives flows through openings into the magnetic disk drive in question, so that the temperature rise of the magnetic disk drive whose blast means are stopped can be suppressed to the minimum, to thereby provide a highly reliable magnetic disk storage system.

What is claimed is:

1. A magnetic disk storage system comprising a plurality of magnetic disk drives provided in a system casing, each of the magnetic disk drives including magnetic disks for storing information, magnetic heads for reading and writing information between said magnetic disks, a carriage mechanism for positioning said magnetic heads, and a housing for hermetically sealing them, said magnetic disk storage system further comprising partitions for separating and arranging said magnetic disk drives for which partitions are provided between said disk drives so as to form container chambers of the disk drives, and blast means for cooling said magnetic disk drives which blast means are provided in said container chambers, said partitions being formed with openings through which cooling air is passed between adjacent two of said container chambers, each of said openings being positioned in said partitions so that one of said disk drives is cooled by the cooling air which is passed through said openings in one of said partitions from said blast means for an adjacent container chamber to said one of said disk drives when the blast means for said one of said disk drives cannot supply cooling air to said one of said disk drives.

2. A magnetic disk storage system according to claim 1, wherein radiation fins are provided on that surface of the housing of each of said magnetic disk drives against which the cooling air supplied from said blast means is blown.

3. A magnetic disk storage system according to claim 1, wherein said blast means are provided with passage opening/closing means for stopping flows of the cooling air, and control means are provided to open said passage opening/closing means when said blast means are operated.

4. A magnetic disk storage system according to claim 1, wherein detectors are provided for detecting operational conditions of the blast means for said magnetic disk drives.

5. A magnetic disk storage system according to claim 4, wherein opening/closing means of the openings are provided over said openings in the partitions, which opening/closing means are controlled to open/close said openings in response to outputs from said detectors.

6. A magnetic disk storage system according to claim 1, wherein the magnetic disk drives include a dedicated servo system for positioning control having a large number of data surfaces and an exclusive servo surface on which positioning information is recorded so that positioning control is constantly performed on the basis of servo information on said servo surface.

7. A magnetic disk storage system comprising a plurality of magnetic disk drives provided in a system casing, each of the magnetic disk drives including magnetic disks for storing information, magnetic heads for reading and writing information between said magnetic disks, a carriage mechanism for positioning said magnetic heads, and a housing for hermetically sealing them, said magnetic disk storage system further comprising partitions for separating and arranging said magnetic disk drives which partitions are provided between said disk drives, said partitions forming ducts to surround the magnetic disk drives, which ducts, said magnetic disk drives and blast means for cooling said disk drives constitute magnetic disk units, said system casing including frames provided therein to support said magnetic disk units individually, said ducts being formed with openings through which cooling air is passed between adjacent two ducts containing said magnetic disk drives, each of said openings being positioned in said ducts so that said disk drive of one of said magnetic disk units is cooled by the cooling air which is passed through said openings in said ducts from said blast means for an adjacent magnetic disk unit when the blast means for said one magnetic disk unit cannot supply cooling air to said one magnetic disk unit.

8. A magnetic disk storage system according to claim 7, wherein a power source and control circuit boards for said magnetic disk drive are provided in each of said disk units.

9. A magnetic disk storage system according to claim 7, wherein said openings through which the cooling air can be passed are located in the vicinity of a surface of said housing of each magnetic disk drive.

10. A magnetic disk storage system according to claim 7, wherein either said magnetic disk drive units or said magnetic disk drives, which are provided in said system casing, are inclined with respect to the horizontal direction.

11. A magnetic disk storage system according to claim 7, wherein the magnetic disk drive includes a dedicated servo system having a large number of data surfaces and an exclusive servo surface on which positioning information is recorded so that positioning control is constantly performed on the basis of servo information on said servo surface.

12. A magnetic disk storage system comprising a plurality of magnetic disk drives provided in a system casing, each of the magnetic disk drives including magnetic disks for storing information, magnetic heads for reading and writing information between said magnetic disks, a carriage mechanism for positioning said magnetic heads, and a housing for hermetically sealing them, said magnetic disk storage system further comprising partitions for separating and arranging said magnetic disk drives which partitions are provided between said disk drives, said partitions being formed with openings through which the cooling air can be passed between adjacent two of said magnetic disk drives in addition-to inlets and outlets of the cooling air, said partitions forming frames on which the magnetic disk drives-are mounted, which partitions, said magnetic disk drives and blast means for cooling said disk drives constitute magnetic disk drive units, said partitions being provided in said system casing so as to support said magnetic disk drive units individually, said partitions being formed with openings other than inlets and outlets for cooling air for said magnetic disk drive units through which the cooling air can be passed between adjacent two of said magnetic disk drive units, each of said openings being positioned in said partitions so that said disk drive of one of said magnetic disk units is cooled by the cooling air which is passed through said openings in said partitions from said blast means for an adjacent magnetic disk unit when the blast means for said one magnetic disk unit cannot supply cooling air to said one magnetic disk unit.

13. A magnetic disk storage system according to claim 12, wherein a power source and control circuit boards for said magnetic disk drive are provided in each of said disk units.

14. A magnetic disk storage system according to claim 12, wherein said openings through which the cooling air can be passed are located in the vicinity of said housing surface of each magnetic disk drive.

15. A magnetic disk storage system according to claim 12, wherein either said magnetic disk drive units or said magnetic disk drives, which are provided in said system casing, are inclined with respect to the horizontal direction.

16. A magnetic disk storage system according to claim 12, wherein the magnetic disk drives include a dedicated servo system having a large number of data surfaces and an exclusive servo surface on which positioning information is recorded so that positioning control is constantly performed on the basis of servo information on said servo surface.

* * * * *